United States Patent
Goodner

(10) Patent No.: US 7,439,179 B2
(45) Date of Patent: Oct. 21, 2008

(54) HEALING DETRIMENTAL BONDS IN DEPOSITED MATERIALS

(75) Inventor: Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 661 days.

(21) Appl. No.: 11/159,506

(22) Filed: Jun. 22, 2005

(65) Prior Publication Data

US 2006/0292707 A1 Dec. 28, 2006

(51) Int. Cl.
*H01L 21/4763* (2006.01)
*H01L 21/44* (2006.01)

(52) U.S. Cl. ............ 438/681; 438/622; 438/623; 438/624; 438/625; 438/626

(58) Field of Classification Search ............ None
See application file for complete search history.

(56) References Cited

U.S. PATENT DOCUMENTS

| 6,737,365 | B1 | 5/2004 | Kloster et al. | |
| 6,984,591 | B1* | 1/2006 | Buchanan et al. | 438/778 |
| 2003/0183171 | A1* | 10/2003 | Sneh et al. | 118/724 |
| 2004/0130031 | A1 | 7/2004 | Chen et al. | |
| 2004/0170760 | A1 | 9/2004 | Meagley et al. | |
| 2004/0185697 | A1 | 9/2004 | Ott et al. | |
| 2004/0195693 | A1 | 10/2004 | Kloster et al. | |
| 2005/0129926 | A1 | 6/2005 | Kloster et al. | |
| 2005/0215049 | A1* | 9/2005 | Horibe et al. | 438/622 |
| 2006/0014386 | A1* | 1/2006 | Lai et al. | 438/681 |
| 2006/0063394 | A1 | 3/2006 | McSwiney et al. | |

OTHER PUBLICATIONS

Dennis Hausmann et al., "Rapid Vapor Deposition of Highly Conformal Silica Nanolaminates", *Science*, vol. 298, Oct. 11, 2002, p. 402-406.
Philippe de Rouffignac et al., Sealing Porous Low-k Dielectrics With Silica, *Electrochemical and Solid-State Letters*, vol. 7, No. 12, 2004, p. G306-308.
Pending U.S. Appl. No. 11/105,036, filed Apr. 12, 2005. Inventor: Michael D. Goodner, et al.
Pending U.S. Appl. No. 10/984,595, filed Nov. 8, 2004. Inventor: Michael D. Goodner.

* cited by examiner

*Primary Examiner*—Carl Whitehead, Jr.
*Assistant Examiner*—James M Mitchell
(74) *Attorney, Agent, or Firm*—Kenneth A. Nelson

(57) ABSTRACT

A method for healing detrimental bonds in deposited materials, for example porous, low-k dielectric materials, including oxydatively processing a deposited material, processing the deposited material with a trialkyl group III compound, and processing in the presence of an alcohol. Also included in embodiments of the invention are materials with bonds healed by embodiments of the claimed method.

14 Claims, 6 Drawing Sheets

FIG. 1 – Prior Art
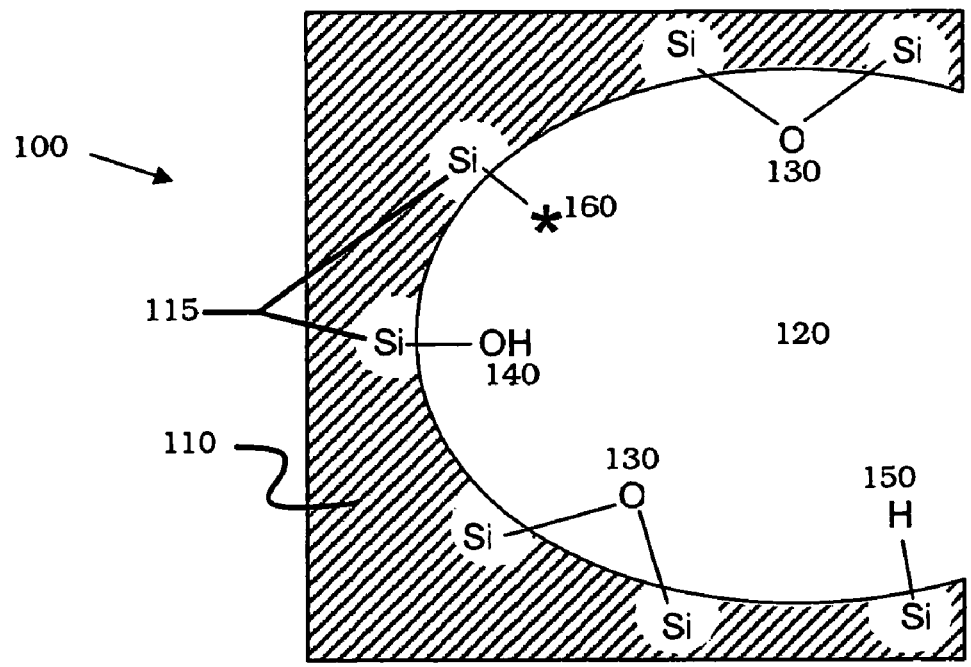
FIG. 2
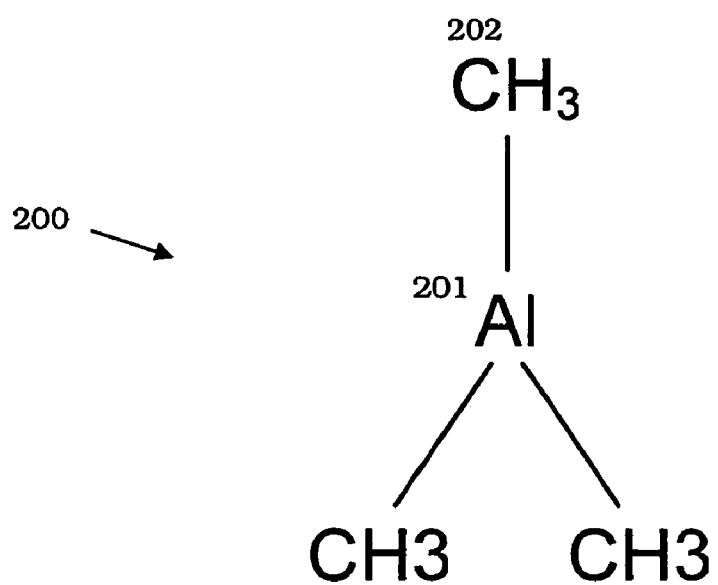

HEALING DETRIMENTAL BONDS IN DEPOSITED MATERIALS

FIELD OF THE INVENTION

The invention relates generally to the field of semiconductor integrated circuit (IC) manufacturing. In particular, the invention relates to a method for healing detrimental bonds in deposited materials in an integrated circuit device.

BACKGROUND OF THE INVENTION

IC manufacturing typically involves the sequential formation of multiple layers to construct a single integrated device. The materials for each layer are chosen either because their properties allow them to inherently meet the performance criteria for the IC device, or because their properties can be altered through the manufacturing process so that they meet those criteria. One type of material deposited to form a layer within an IC device is a dielectric.

Dielectric materials are electrical insulators, used to substantially electrically isolate conductive layers or features within the IC. The ratio of the amount of electrostatic energy that can be stored by a capacitor using a given dielectric material, as compared to the same capacitor with a vacuum as its dielectric, is defined as its 'relative dielectric constant' and is expressed as that material's 'k' value. Low-k dielectric materials may be viewed as those with a dielectric constant ('k' value) below that of silicon dioxide (for $SiO_2$, k≈4.0-4.2).

As transistor gate widths have shrunken with each subsequent generation of IC development, reducing interconnect delay has now become important just like reducing transistor switching frequency for boosting IC operating speeds. Two contributors to interconnect delay are the resistance of the metal (traditionally aluminum) used for the circuit lines, and the capacitance of the dielectric (traditionally silicon dioxide; $SiO_2$) used for the interlayer dielectric (ILD) material.

To improve speed within the circuit lines, copper, which has approximately 30% lower electrical resistance than aluminum, has replaced aluminum in many high performance IC devices. However, copper has the lowest resistivity of metals incorporated into IC devices, making reduction of dielectric constant of the ILD material an area of strong interest for realizing further decreases in interconnect delay times.

One approach for producing low-k ILD materials involves making the deposited ILD material porous. Porous ILD materials may have substantially lower k values, however, they also are less dense, have greater exposed surface area, and may possess reduced mechanical strength. As a result, porous ILD materials may be damaged or otherwise adversely affected by subsequent IC device fabrication processing. Types of processing that may result in damage to the ILD include dry processing, such as plasma etch, or wet processing, such as resist clean.

Silicon dioxide is one commonly used ILD material. In one instance, molecular bonds within a deposited material, silicon-oxygen-silicon (Si—O—Si) bonds or silicon-carbon (Si—C) bonds for example, may break during processing and subsequently form silicon-hydrogen (Si—H) bonds or silicon-hydroxy (Si—OH) bonds. Such resulting bonds may be more labile, contributing to poor film stability. They may also be more polarizable, thus increasing the dielectric constant of the film. In such instances, the resulting bonds are detrimental to the stability of the deposited material.

In another instance, 'dangling' silicon bonds (silicon radicals possessing unpaired electrons) may remain after the deposition process, or Si—H bonds may be formed during deposition. These dangling or Si—H bonds may subsequently form Si—OH bonds upon oxidation, again leading to some of the problems already mentioned. Additionally, dangling bonds may crosslink, increasing stress within the ILD material and leading to ILD cracking or low cohesive strength within the deposited ILD material.

Currently, reducing the aggressiveness of the wet or dry processes used to produce the deposited material is a method to avoid broken or dangling bonds. While this approach may provide some relief, integrating such an approach into the IC fabrication process poses challenges. Processing such as resist strip involves balancing processing parameters to produce integrated circuit devices meeting stringent and ever increasing performance requirements and tightening dimensional tolerances. Such processing becomes more difficult to accomplish successfully when critical process parameters are altered for the purpose of preventing broken or dangling bonds.

The presence of broken, detrimental or dangling bonds (collectively referred to hereinafter as 'detrimental bonds') in deposited ILD materials is an impediment to successful IC fabrication and to the optimal and reliable performance of IC devices incorporating such materials. Other types of deposited materials may likewise be affected by the presence of detrimental bonds during or after processing.

BRIEF DESCRIPTION OF THE DRAWINGS

FIG. 1 depicts a cross-sectional diagrammatic view of a pore in a deposited material with detrimental bonds, as known in the prior art.

FIG. 2 diagrammatically depicts the chemical structure of a trialkyl group III compound, trimethylaluminum, according to one embodiment of the invention.

DETAILED DESCRIPTION OF THE INVENTION

Figure 3A:
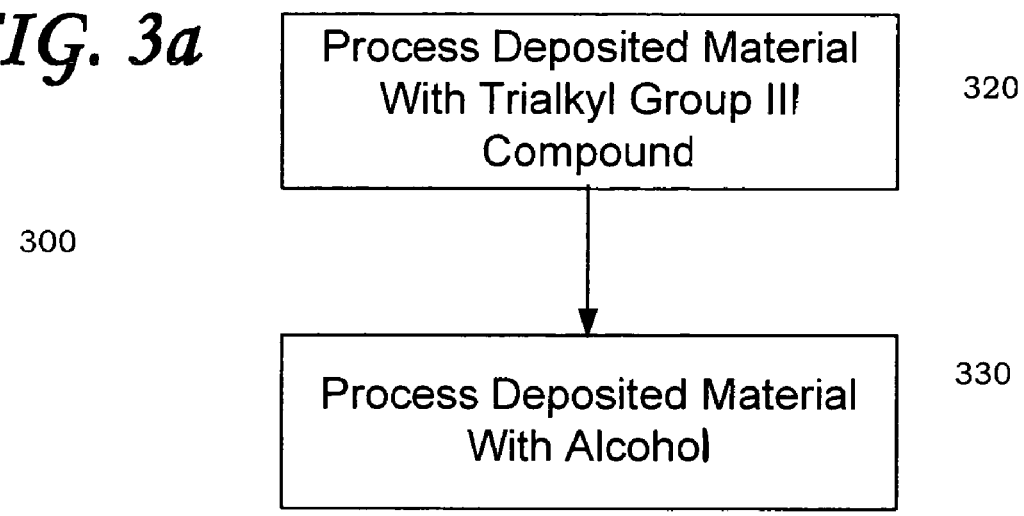
FIGS. 3a, 3b, and 4 are block diagrams depicting embodiments of a method for healing detrimental bonds in a deposited material.

Disclosed are numerous embodiments for healing detrimental bonds in a deposited material. In an embodiment, a dielectric material is disposed adjacent a substrate. A substrate may in alternate embodiments include an integrated circuit substrate such as a silicon wafer, a gallium arsenide wafer, or other similar materials as are known in the art. In another embodiment, a substrate may be a conductive layer disposed adjacent a silicon wafer. In still another embodiment, a substrate may be one or more non-conductive layers disposed between the deposited material and a silicon wafer. However, as would be understood by one of ordinary skill in the art, a substrate may include any material having a surface upon which a material may be deposited.

In an embodiment, a deposited material may be an interlayer dielectric material. An interlayer dielectric material may include a deposited layer or other structural feature including an oxide glass. One embodiment of a deposited layer or structural feature of oxide glass may include silicon dioxide. The layer or structural feature may remain largely intact as deposited, or in embodiments, the layer or structural feature may be subsequently changed in size, shape, or thickness by a subtractive etch process, planarization process, or secondary deposition process. In other embodiments, a deposited material may be a thin film or a thick film. As should be understood by one of ordinary skill in the art, numerous embodiments may include deposited materials other than oxide glass. Likewise, numerous embodiments may include layers or structures wherein the size or shape of said layers or structures has been altered by processes other than subtractive etch, planarization, or secondary deposition processes. Additionally, thin films or thick films are not exclusive embodiments regarding film thickness, as films (or layers of deposited materials in general) may be deposited in a great variety of thicknesses according to embodiments of the invention. Thus, it should be understood that embodiments of the invention include a great variety of deposited materials in which detrimental bonds may be found.

In an embodiment, a deposited material may include elemental materials integrated into its structural lattice to change its electrical properties or to alter its mechanical strength. In an exemplary embodiment, an integrated elemental material may include a low concentration of aluminum in a deposited material of silicon oxide to improve the mechanical strength of the silicon oxide.

According to embodiments, the deposited material may be made porous by a variety of methods; for example thermal processing, wet chemical processing, dry processing with plasma, or others as are known in the art. When the deposited material is a dielectric material, according to an embodiment of the invention, a lower k value may be achieved by making the material porous. A lower k value in a dielectric material may help enable better performance in an integrated circuit device including the low k value dielectric material. In another embodiment, a porous deposited material may also provide benefits in other applications, such as providing a more suitable bonding surface for bonding materials together. In still other embodiments, a porous deposited material may provide greater exposed surface area for retention of substances such as an adhesive or a desiccant, or improved flow management of an ink or a lubricant. As would be recognized by one of skill in the art, a porous deposited material may provide benefits in a variety of applications.

A porous deposited material may be subjected to numerous manufacturing processes during and after formation. Each manufacturing process may affect the structure of the deposited material, sometimes detrimentally. Particularly susceptible to damage may be the material at the surface of open pores, which are exposed to plasmas and wet chemicals during processing. FIG. 1 depicts a representative cross-section 100 of a pore 120 at the surface of a deposited material 110, wherein the deposited material includes silicon 115. Also depicted in FIG. 1 are several possible detrimental bonds that may result from forming or processing a porous deposited material.

In FIG. 1, several relatively stable Si—O—Si bonds 130 remain after processing. However, also shown are several examples of Si—O—Si or Si—C bonds that have been broken during processing, resulting in formation of detrimental bonds. In one example, a silicon bond is left dangling 160, forming a 'silicon radical'. As would be understood by one of ordinary skill in the art, such dangling bonds may readily bond with other radicals, ionic elements or compounds. In the illustrated examples, a bond may form with a proton or a hydronium ion 150 forming a Si—H bond, or with a hydroxyl radical or hydroxide ion 140 forming a Si—OH bond. These bonds are more labile, providing poor stability as these bonds undergo subsequent chemical changes.

To eliminate detrimental bonds in a deposited material as described, embodiments of the invention include processing with a trialkyl group III compound. FIG. 2 shows the general chemical formula of trimethylaluminum 200 used according to an embodiment. Trimethylaluminum includes an aluminum atom 201 bonded to three methyl groups 202. Trialkyl group III compounds that may be used according to other embodiments include trimethylboron, triethylboron, triethylgallium, or other trialkyl group III compounds that may be described by the formula $M(C_nH_{2n+3})_3$, wherein n is equal to or less than four (4), and M may be any group III element, including boron (B), aluminum (Al), gallium (Ga), and indium (In).

Figure 3B:
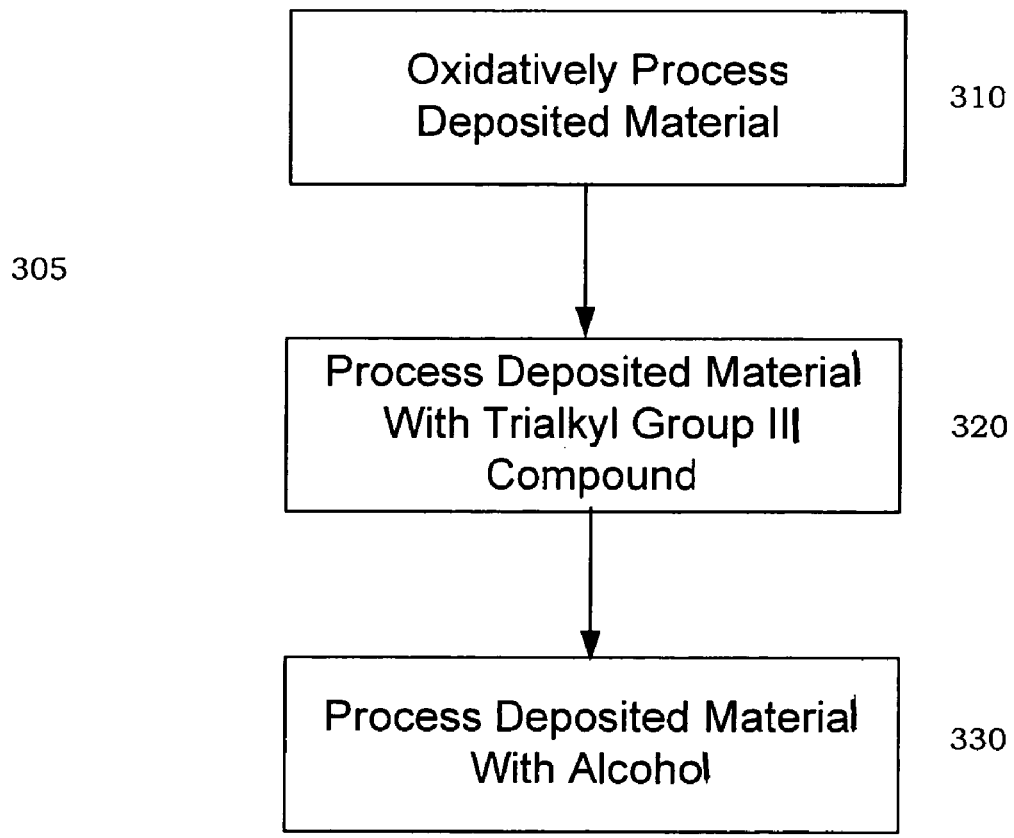

In the following description, embodiments of a method are presented for substantially eliminating detrimental bonds in a deposited material, thus 'healing' the deposited material by remedial processing. The selection of which embodiment to employ in a particular situation may be substantially based upon the content of detrimental bonds in the deposited material. For example, in an embodiment of the invention, as substantially depicted in FIG. 3a, a method for healing detrimental bonds in a deposited material may include processing the deposited material in the presence of a trialkyl group III compound 320, then processing in the presence of an alcohol 330. For deposited materials possessing a lower content of detrimental bonds, the embodiment depicted in FIG. 3a may provide for healing substantially all of the detrimental bonds. In another embodiment, as substantially depicted in FIG. 3b, a method for 'healing' detrimental bonds in a deposited material may include all three of oxidative processing 310 processing in the presence of a trialkyl group III compound 320 and processing in the presence of an alcohol 330. For deposited materials possessing a higher content of detrimental bonds (such as Si—H bonds), the embodiment depicted in FIG. 3b may provide for healing substantially all of the detrimental bonds.

Figure 4:
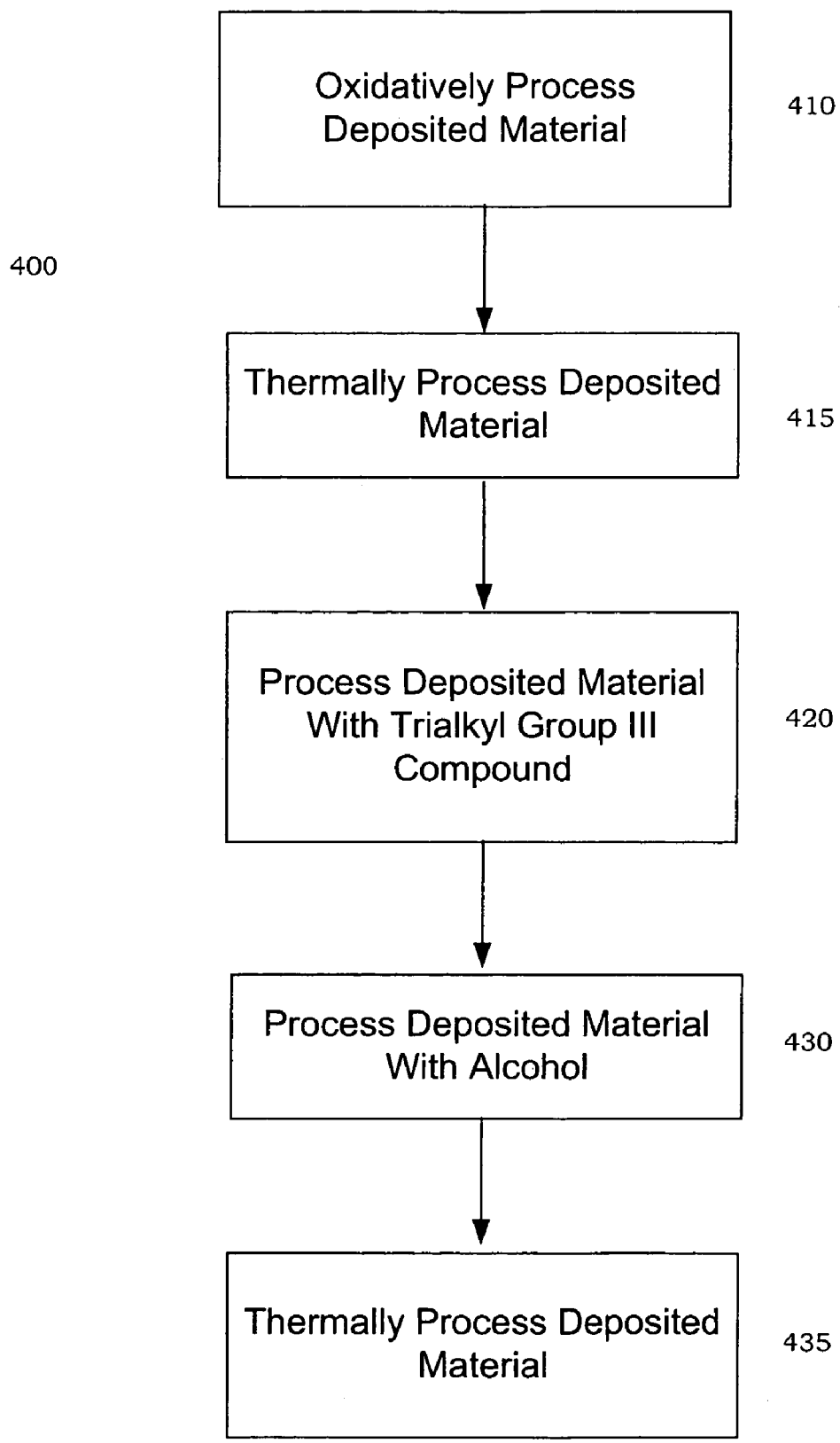

An exemplary embodiment of the invention is substantially depicted in FIG. 4. In this embodiment, the deposited material is first oxydatively processed 410. The deposited material is processing in the presence of an oxidant at a first temperature for a first duration, then either the remaining unreacted oxidant is removed from the process environment, or alternatively, the deposited material is moved to another process environment not containing the oxidant, and in either case, the deposited material is processed at a second temperature for a second duration 415. The deposited material is then processed with a trialkyl group III compound at a third temperature for a third duration 420. Next, the deposited material is processed in the presence of an alcohol 430 at a fourth temperature for a fourth duration. Finally, the remaining unreacted alcohol is removed from the process environment, or alternatively, the deposited material is moved to another process environment not containing alcohol, and in either case, the deposited material is processed at a fifth temperature for a fifth duration 435. Details of this and numerous other embodiments will now be described in more detail.

Figure 5A:
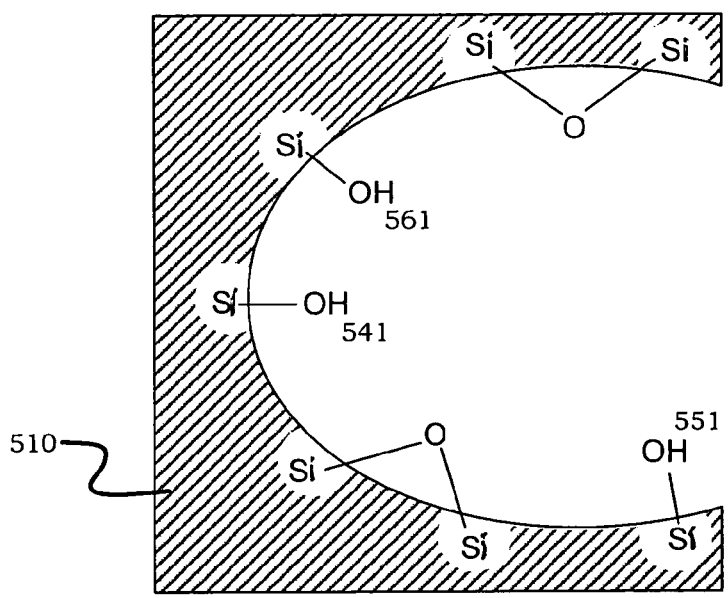
FIG. 5a depicts a cross-sectional diagrammatic view of a pore in a deposited material, processed in an oxidizing environment according to an embodiment of the invention.

In an embodiment of the invention, a deposited material 510 with a high content of detrimental bonds is oxydatively processed to replace Si—H bonds 150 and Si radicals 160 with Si—OH bonds 551 and 561 as shown in FIG. 5a. In an embodiment, a weak oxidizing environment may be sufficient to oxidize substantially all of the Si—H bonds 150 and form Si—OH moieties 551 on the surface of the deposited material.

Oxidative processing may include processing of the deposited material by exposure to an oxidizing agent (oxidant). In an embodiment, water ($H_2O$) may be used as an oxidant to contribute oxygen to the formation of Si—OH bonds. In another embodiment, hydrogen peroxide ($H_2O_2$) may be used as an oxidant. In another embodiment, oxygen ($O_2$) in nitrogen ($N_2$) may be used as an oxidant. In still another embodiment, oxygen ($O_2$) in argon ($Ar_2$) may be used as an oxidant. Combinations of two or more oxidants may be used according to various embodiments. Whichever oxidant, or combination of oxidants are used according to embodiments of the invention, the oxidant(s) should be provided in a vapor phase during oxidative processing.

Oxidative processing may also include thermal processing of the deposited material. Thermal processing, in one embodiment, may include elevating the temperature of the environment surrounding the deposited material to a first temperature, and maintaining the first temperature for a first duration. In an exemplary embodiment, the first temperature may be found within the range of 100-350° C. In another embodiment, the first temperature may be found within the narrow range of 200-300° C. In an embodiment, the first duration may be found within the range of 15-900 seconds. In another embodiment, the first duration may be found within a narrower range of 120-300 seconds. In an embodiment, the oxidative processing may include processing the deposited material at a first pressure within a range of 0.1-850 torr. In an embodiment, the first pressure may include the sea level ambient atmospheric pressure of approximately 760 torr. However, in other embodiments, particularly at elevations higher than sea level, or within specialized manufacturing environments wherein the atmospheric pressure is maintained significantly lower or higher than the local atmospheric pressure, as are known in the art, ambient atmospheric pressure may be somewhat lower or higher than 760 torr. In other embodiments, the pressure may be kept as low as 1-100 torr.

In still other embodiments, an atmospheric pressure other than the ambient atmospheric pressure may be selected as the first pressure. For example, in embodiments wherein the utilized oxidant is liquid at room temperature and ambient pressure, oxydatively processing the deposited material in a weak oxidizing environment may typically include processing at a temperature and pressure within a range that will provide for the liquid phase oxidant substantially changing to a vapor phase.

In an exemplary embodiment, water may be used as an oxidant wherein the processing temperature may be raised sufficiently to form water vapor while maintaining the processing pressure approximately equal to the ambient pressure. In another embodiment, the processing pressure may be reduced and the temperature may be raised, the effect of the reduced processing pressure being to also reduce the temperature at which water vapor may be formed. In still another embodiment, both the temperature and the processing pressure may be raised, the temperature being raised sufficiently to form and maintain water vapor despite the increase in processing pressure.

As would be understood by one of ordinary skill in the art, similar adjustment of processing temperature and processing pressure may produce a weak oxidizing environment by converting those oxidants that are typically found in liquid phase at room temperature and ambient pressure to vapor phase, such as $H_2O_2$ in an embodiment. Therefore, in embodiments of the invention wherein the oxidant is utilized in a vapor phase, the first pressure may be found in a range between approximately 0.1-850 torr. In another embodiment, the pressure may be found within the narrow range of 1-100 torr.

The effectiveness of the oxidizing environment may be varied by controlling the concentration of oxygen in the oxidizing environment. Thus, providing a higher concentration of oxygen in the oxidizing environment may convert substantially all detrimental bonds to Si—OH moieties, even in a deposited material with a large number of detrimental bonds. For deposited materials with fewer detrimental bonds, a lower concentration of oxygen in the oxidizing environment may provide substantially satisfactory results.

In an exemplary embodiment, wherein oxygen in nitrogen is used as an oxidant, the oxygen concentration may be within the range of 5-20%. In another embodiment, wherein oxygen in argon is used as the oxidant, the oxygen concentration may also be found within the range of 5-20%. An embodiment of the invention includes the use of oxygen alone at a low atmospheric pressure as the oxidant, however, as would be appreciated by one possessing skill in the art, the risk of an explosion may increase under certain conditions. Therefore, most exemplary embodiments of the invention include an oxidant wherein oxygen is not the sole constituent.

In an embodiment, a more aggressive oxidizing environment may be provided by oxidants in a plasma phase rather than in a vapor phase. A plasma phase oxidant may be used in an embodiment wherein the deposited material includes a large amount of dangling bonds. In an embodiment, the first pressure within an aggressive oxidizing environment may be selected within the range of 0.1-50 torr. In another embodiment, the pressure within an aggressive oxidizing environment may be selected within the narrower range of 1-10 torr.

In an embodiment, after treatment with water as an oxidizer, the deposited material may be thermally processed at a second temperature for a second duration to remove any remaining water from the deposited material. During this processing, the only water in the processing environment surrounding the deposited material should be that which has been removed from the deposited material. Thus, it is understood that water is not added to the processing environment from external sources during processing to remove remaining water from the deposited material. Rather, in an embodiment to remove remaining unreacted water, the deposited material may be moved to a separate environment to which water has not been added, and be processed at a second temperature for a second duration. Alternately, the deposited material may remain in the same oxidative processing environment, but in an embodiment, all remaining liquid and vapor phase water may be evacuated from the environment prior to processing at a second temperature for a second duration.

In an embodiment, the second temperature may be within the range of 25-350° C., and the second duration may be equal to or greater than 5 seconds. As would be understood by one possessing ordinary skill in the art, selection of particular temperatures and durations from among those provided in the foregoing embodiment should provide for substantial elimination of all remaining water in the deposited material, but may otherwise be selected at the discretion of the user.

Still other embodiments may include using other oxidizing compounds as are known in the art. It should be understood that the scope of the articulated embodiments are for exemplary purposes only, and are not to be construed as limiting the specific oxidants to only those listed. Nor should they be construed to limit embodiments to the use of a single oxidant, as the combination of different oxidants in separate embodiments is anticipated by the inventors to provide beneficial results in some situations. For example, in an embodiment, nitrous oxide ($N_2O$) may be used to oxidize Si—H bonds either by itself, in an inert carrier gas, or in combination with another oxidizer. Selection and use of different embodiments may involve consideration of the type of deposited material, the extent of the presence of the detrimental bonds, the equipment to be used to perform processing according to embodiments of the invention, the intended application (type of use) of the deposited material when finally formed, and other relevant considerations.

Figure 5B:
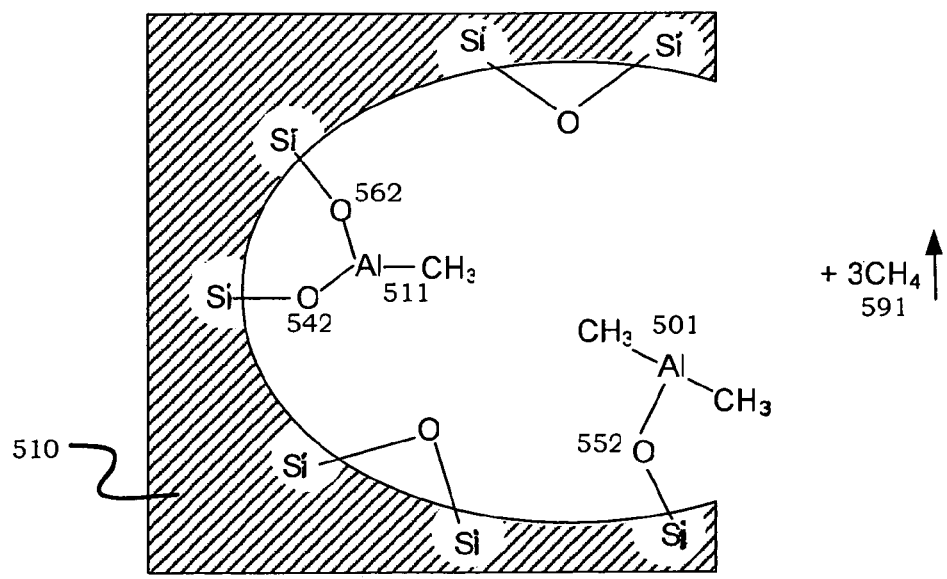
FIG. 5b depicts a cross-sectional diagrammatic view of a pore in a deposited material, processed with a trialkyl group III compound according to an embodiment of the invention.

In an embodiment of the invention, after processing in an oxidizing environment, the deposited material may be processed with a trialkyl group III compound. In an exemplary embodiment, the selected trialkyl group III compound may be trimethylaluminum (TMA) 200. In an embodiment substantially shown in FIG. 5b, the TMA 200 reacts with a Si—OH group 551 to form a dimethylaluminum structure 501 pendant from an oxygen bond 552. Methane 591 is liberated in the reaction. In another embodiment, also shown in FIG. 5b, TMA 200 may form local cross-links, eliminating detrimental Si—OH bonds 541, 561 by replacing their terminal hydrogen with a methylaluminum structure 511 bonded to the remaining oxygen 542, 562. Methane 391 is liberated for each of the bonds formed Processing with a trialkyl group III compound should substantially eliminate detrimental bonds in the deposited material 510. By an embodiment of the invention, varying the processing temperature, duration and/or pressure may decrease or increase the depth of penetration of the TMA into the deposited material, with higher temperature, longer duration and higher pressure generally resulting in increased penetration into the deposited material. Deeper penetration of TMA into a deposited porous material possessing high pore connectivity may affect more complete healing of detrimental bonds, while conversely, if analysis shows that the majority of detrimental bonds are near the surface of the deposited material, as may be the case of a porous material with low pore connectivity, shallower penetration may be sufficient. In an embodiment of the invention, the third temperature may be found within the range of 100-400° C., and the third duration may be within the range of 5-300 seconds. In another embodiment, the third temperature may be found within a more narrow range of 200-300° C. In other embodiments, the pressure at which TMA is exposed to the deposited material may be from 0.1-100 torr, or in another embodiment 1-50 torr.

In an embodiment, a deposited material may be processed so that the trialkyl group III compound penetrates only shallowly into the surface of the deposited material, remaining substantially at or near the surface of the deposited material. In another embodiment, a deposited material may be processed so that the trialkyl group III compound penetrates substantially throughout the deposited material. As may be readily understood from these examples and other discussions provided herein, healing a deposited material according to embodiments of this invention may also include any amount of penetration of the trialkyl group III compound into a deposited material between these two recited examples.

As would be understood by one of ordinary skill in the art, adding aluminum into or onto a deposited material may change the electrical properties of the deposited material. In one embodiment, adding aluminum to a porous, low-k, deposited interlayer dielectric material may increase the k-value of the material. If too much aluminum is added to the deposited material, it may be possible for the deposited material to lose its low-k characteristics. In an embodiment of the invention, aluminum from a trialkyl group III compound may be incorporated into the deposited material in the range of approximately 2-5 molar percent, at which substantially all of the detrimental bonds may be healed, and the low-k dielectric properties of the deposited material may be maintained. In an embodiment of the invention, addition of 3-4 molar percent aluminum relative to silicon in the deposited material may only increase the k-value by approximately 5%.

In embodiments where substantially complete removal of all detrimental bonds may require adding aluminum in the form of a trialkyl group III compound such as trimethylaluminum, that may increase the k-value of the material, the user may choose an embodiment of this invention wherein fewer than substantially all detrimental bonds are eliminated. This may be achieved, in one embodiment, by permitting only partial penetration of the trialkyl group III compound into a deposited material. In another embodiment, this may be achieved by using a trialkyl group III compound that does not increase the k-value to the same extent as aluminum, whereby greater penetration into a deposited material or healing substantially all detrimental bonds may be possible without substantially affecting the k-value of the deposited material.

As should be understood by the foregoing description, processing with a trialkyl group III compound may include numerous combinations of the process conditions of temperature, pressure, and duration to achieve substantial elimination of detrimental bonds in a variety of deposited materials. Such combinations may be made as individual embodiments of the invention, without departing from the spirit of the invention.

Figure 5C:
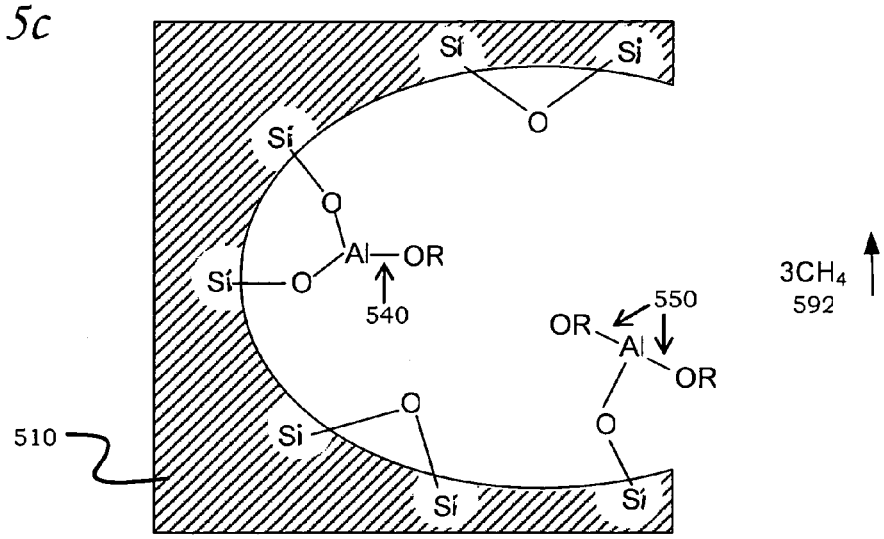
FIG. 5c depicts a cross-sectional diagrammatic view of a pore in a deposited material, processed with alcohol according to an embodiment of the invention.

Following processing with a trialkyl group III compound, highly reactive Al—C bonds may remain in the deposited material. In an embodiment, these reactive Al—C bonds may be removed by further processing the deposited material in the presence of an alcohol. As shown in FIG. 5c, processing in the presence of alcohol removes the bonded methane groups shown as components of the pendant methylaluminum 511 and dimethylaluminum 501 and replaces them with Al—OR bonds 540, 550. Methane 392 is thereby released from the deposited material. The described replacement provides a 'cap' comprised of functional alcohol groups bonded to the remaining aluminum at each bond site. By the addition of this cap, the previously detrimental bonds in a deposited material 510 are healed, with no highly reactive bonds remaining in the material.

In numerous embodiments, simple alcohols such as alkane alcohols may be used. In an exemplary embodiment, methanol may be used. The small size of the methanol cap on each healed detrimental bond helps to minimize the mass added to the pores, while also not substantially reducing the level of porosity in a deposited material. Other embodiments may include the use of ethanol, propanol, butanol, or other alkane alcohols.

In other embodiments, alkylsilanols may be used. An exemplary embodiment of an alkylsilanol may be triethylsilanol. Alkylsilanols add more mass to the pores than methanol or other simply alkane alcohols, however, they may also provide for substantially healing detrimental bonds in a deposited material. In other embodiments, other alkylsilanols are expected to provide substantially similar healing of detrimental bonds.

Processing with an alcohol should eliminate any remaining Al—C bonds. By an embodiment of the invention, varying the processing temperature, duration and/or pressure may decrease or increase the depth of penetration of the alcohol into the deposited material, with higher temperature, longer duration and higher pressure generally resulting in increased penetration into the deposited material. Deeper penetration of the alcohol into the deposited porous material possessing high pore connectivity may affect more complete removal of Al—C bonds while conversely, if analysis shows that the majority of the Al—C bonds are near the surface of the deposited material, as may be the case of a porous material with low pore connectivity, shallower penetration may be sufficient. In an embodiment of the invention, the fourth temperature may be found within the range of 25-400° C., and the fourth duration may be within the range of 5-300 seconds. In another embodiment, the fourth temperature may be found within a more narrow range of 50-200° C. In other embodiments, the pressure at which alcohol is exposed to the deposited material may be from 0.1 to 100 torr, or in another embodiment 1 to 50 torr.

After processing the deposited material with alcohol, the deposited material may be thermally processed at a fifth temperature for a fifth duration to remove any remaining unreacted alcohol from the deposited material. During this processing, the only alcohol in the processing environment surrounding the deposited material should be that which has been removed from the deposited material. Thus, it is understood that alcohol is not added to the processing environment from external sources during processing to remove remaining alcohol from the deposited material. Rather, in an embodiment to remove remaining alcohol, the deposited material may be moved to a separate environment to which alcohol has not been added, and be processed at a fifth temperature for a fifth duration. Alternately, the deposited material may remain in the same oxidative processing environment, but in an embodiment, all remaining alcohol may be evacuated from the environment prior to processing at a fifth temperature for a fifth duration.

In an embodiment, the fifth temperature may be within the range of 25-350° C., and the fifth duration may be greater than or equal to 5 seconds. As would be understood by one possessing ordinary skill in the art, selection of particular temperatures and durations from among those provided in the foregoing embodiment should provide for substantial elimination of the remaining unreacted alcohol in the deposited material, but may otherwise be selected at the discretion of the user.

Each of processing a deposited material in an oxidizing environment, processing in the presence of a trialkyl group III compound, and processing in the presence of an alcohol, can be performed in processing equipment that allows exposure to a vapor or a plasma under controlled conditions of temperature, pressure, and atmospheric composition. For example, in embodiments, each of processing the deposited material in the presence of a trialkyl group III compound, and of processing in the presence of alcohol, may be performed in an atmosphere with low levels of oxygen. Likewise, in other embodiments, the processing of the deposited material at a second temperature for a second duration (after processing in an oxidizing environment), or at a fifth temperature for a fifth duration (after processing in the presence of an alcohol) may also be performed in an atmosphere with low levels of oxygen.

Several types of processing equipment may be used for the described embodiments. In separate embodiments, one may choose to use either HMDS (hexamethyldisilazne) prime ovens or vertical diffusion furnaces. One may choose to use deposition tools such as chemical vapor deposition (CVD) tools in an embodiment, or plasma enhanced chemical vapor deposition (PECVD) tools in another embodiment. The aforementioned process equipment are not meant to constitute an exclusive listing of those that can be used according to embodiments of the invention. Rather, they serve an exemplary function as process equipment that may provide for the process conditions as recited in embodiments of the invention. As would be understood by one of ordinary skill in the art, other process equipment may be used in embodiments of the invention to the extent that they are able to likewise provide the recited process conditions.

Figure 6:
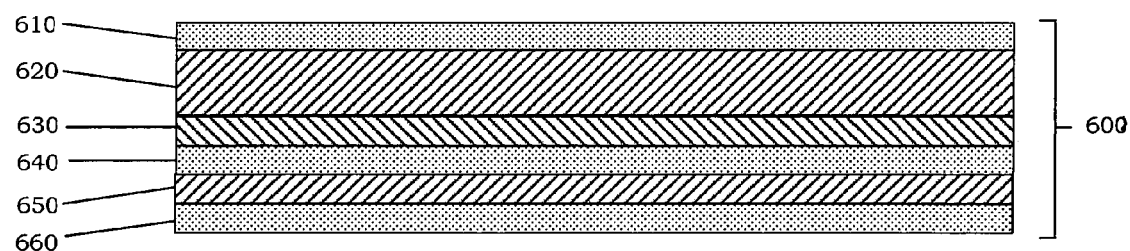
FIG. 6 is a cross-sectional side view showing embodiments of a deposited material formed adjacent a substrate according to embodiments of the invention

FIG. 6 depicts a cross-sectional view of an assembly including a substrate, 620 upon which are disposed numerous materials. Depicted is a healed deposited material 610 according to one embodiment of the invention wherein a healed deposited material 610 may be disposed directly adjacent a substrate 620. Also depicted is an embodiment wherein a healed deposited material 640 may be disposed directly adjacent another material 630 which is in turn disposed directly adjacent a substrate 620. In this embodiment, the material 630 disposed directly adjacent the substrate 620 itself may be considered a substrate for the healed deposited material 640. In still another embodiment, a healed deposited material 640 may be disposed such that two or more materials 630, 640, 650 are disposed between a substrate and a healed deposited material 660. As can be understood from FIG. 6, an assembly 600 can be formed in which is included any one of the individual embodiments of a healed deposited material shown in FIG. 6 and previously described. Alternately, an assembly substantially similar to the assembly 600 depicted in FIG. 6 may contain any combination of two or more of the embodiments of a healed deposited material as shown in FIG. 6 and previously described.

Figure 7:
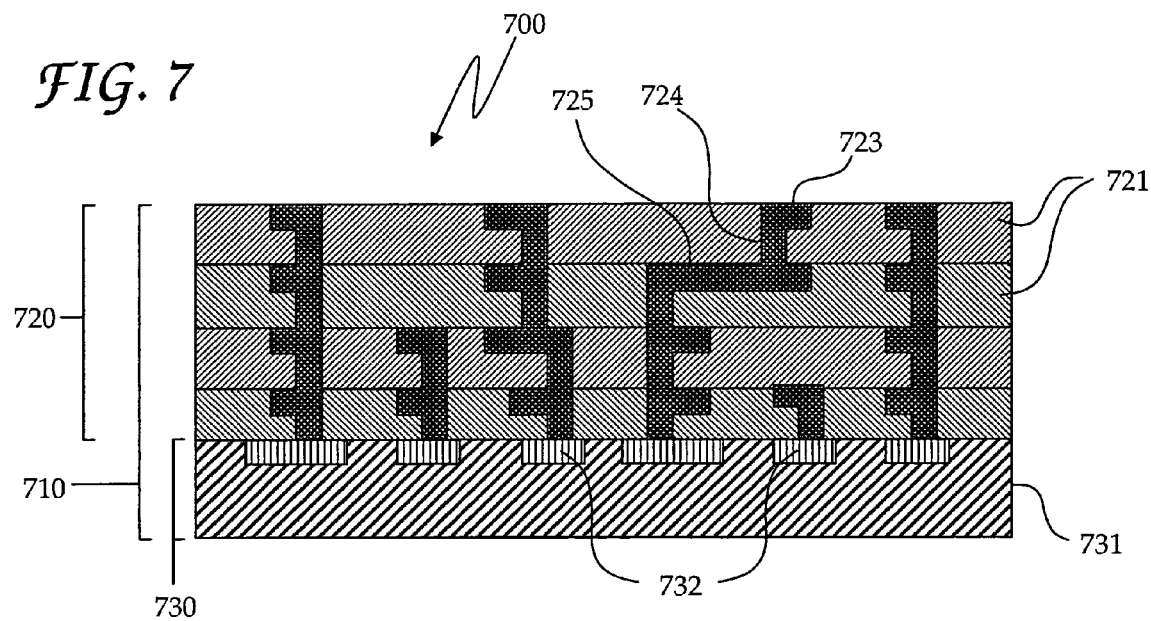
FIG. 7 is a schematic diagram illustrating a cross-sectional view of the interconnect structures and deposited materials in an integrated circuit device according to an embodiment of the invention.

One embodiment of an assembly 600, as substantially shown in FIG. 6 and previously described may be an integrated circuit device. FIG. 7 illustrates one embodiment of an integrated circuit device 700 including one or more layers 721 of a healed deposited material. In embodiments substantially similar to that shown in FIG. 7, healed deposited materials may be provided to serve a performance requirement, such as electrical isolation of conductive features including conductive pads 723, vias 724, traces 725, or other conductive features as are known in the art. Similarly, embodiments of the invention may provide electrical isolation of conductive layers of the integrated circuit from one another, or from conductive features as mentioned. One of ordinary skill in the art would recognize the benefits of a healed deposited material used as an interlayer dielectric (ILD) material, particularly a porous, low-k ILD material formed according to embodiments of the invention, as described herein. This is useful to the proper and improved performance of the finished device in normal use, in contrast with a similar device possessing a deposited material that includes detrimental bonds.

An integrated circuit device 710 may include a substrate 731 (in an exemplary embodiment, a silicon wafer), with functional elements 732 of the device formed on its surface. Sequentially, layers of a conductive and non-conductive stack 720 may be formed including conductive elements 723-725 as well as the non-conductive layers of ILD materials 721. As mentioned, the layers of the ILD materials 721, may have received treatment to make them porous, to help reduce their k-value. In separate embodiments, this treatment may include exposure to at least one of heat, electron beam, ultraviolet energies, or others as known in the art. In an embodiment, a healed deposited material disposed adjacent a conductive feature or layer may be disposed upon the conductive feature or layer. In another embodiment, a conductive feature or layer may be disposed upon a healed deposited material so that the healed deposited material is disposed adjacent the conductive feature or layer. In still another embodiment, a conductive feature may be formed through a healed deposited material so that the healed deposited material is disposed adjacent the conductive feature. This may be true whether the conductive feature formed through the healed deposited material is formed before the healed deposited material is deposited, or formed after the healed deposited material is deposited.

Figure 8:
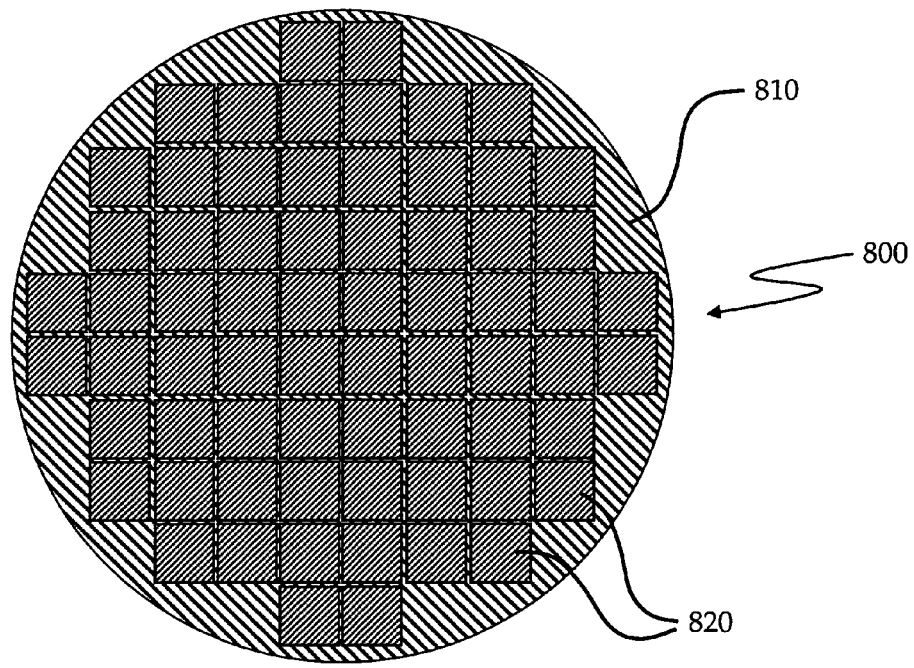
FIG. 8 depicts an integrated circuit substrate comprising a silicon wafer with numerous integrated circuit devices being formed thereupon, and including deposited materials according to an embodiment of the invention.

FIG. 8 shows an assembly 800 according to an embodiment of this invention, wherein a substantial number of individual integrated circuit (IC) devices 820 including one or more healed deposited materials may be formed on an integrated circuit substrate 800 comprising a silicon wafer 810. In alternate embodiments, the number of individual IC devices formed upon an integrated circuit substrate may be as few as only one, or as many as can be formed upon a substrate. As would be easily understood by one of ordinary skill in the art, the number of individual IC devices included in any particular embodiment may be affected by such considerations as the size or material of the substrate, the size or purpose of the IC device, the limitations of manufacturing tools and processes used throughout the manufacturing process, and numerous other considerations. Therefore, FIG. 8 is exemplary only of one embodiment among many within the scope of the current invention.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

What is claimed is:

1. A method, comprising:
   healing detrimental bonds in a deposited material by remedial processing,
   the remedial processing including processing the deposited material with a trialkyl group III compound, and then processing the deposited material with alcohol.

2. The method of claim 1, wherein the deposited material is first oxydatively processed.

3. The method of claim 2 wherein an oxidant for the oxidative processing is at least one of water, hydrogen peroxide, oxygen in nitrogen, and oxygen in argon.

4. The method of claim 2 wherein the oxidative processing includes processing the deposited material at a first temperature in the range of 100-350 degrees Celsius for a first duration in the range of 15-900 seconds.

5. The method of claim 2 wherein the oxidative processing includes processing the deposited material at a second temperature in the range of 25-350 degrees Celsius for a second duration of greater than or equal to five seconds.

6. The method of claim 2 wherein the oxidative processing comprises processing the deposited material at a first pressure within the range of 0.1-850 torr.

7. The method of claim 2 wherein the oxidative processing comprises processing the deposited material in a plasma.

8. The method of claim 1 wherein processing the deposited material with a trialkyl group III compound comprises processing the deposited material at a third temperature in the range of 100-400 degrees Celsius for a third duration within the range of 5-300 seconds.

9. The method of claim 1 wherein processing the deposited material with a trialkyl group III compound comprises processing the deposited material at a pressure within the range of 0.1-100 torr.

10. The method of claim 1 wherein the trialkyl group III compound comprises a compound with the chemical formula $M(C_nH_{2n+3})_3$, where n<4 and M is a group III element including at least one of aluminum, boron, gallium, and indium.

11. The method of claim 1 wherein the trialkyl group III compound comprises at least one of trimethylaluminum, triethylboron, and triethylgallium.

12. The method of claim 1 wherein the alcohol is at least one of an alkane alcohol and an alkylsilanol.

13. The method of claim 1 wherein the processing the deposited material with an alcohol comprises processing the deposited material at a fourth temperature within the range of 25-400 degrees Celsius for a fourth duration within the range of 5-300 seconds.

14. The method of claim 1, further comprising processing the deposited material at a fifth temperature within the range of 25-350 degrees Celsius for a fifth duration of greater than or equal to five seconds.

* * * * *